US008503255B2

(12) United States Patent
Sasaki

(10) Patent No.: US 8,503,255 B2
(45) Date of Patent: Aug. 6, 2013

(54) SEMICONDUCTOR STORAGE DEVICE INCLUDING PLURAL CLOCK OSCILLATOR CIRCUITS OPERATING AT DIFFERENT FREQUENCIES

(75) Inventor: Takahiko Sasaki, Nerima-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 344 days.

(21) Appl. No.: 12/818,678

(22) Filed: Jun. 18, 2010

(65) Prior Publication Data
US 2011/0205779 A1 Aug. 25, 2011

(30) Foreign Application Priority Data
Feb. 24, 2010 (JP) ................................. 2010-039302

(51) Int. Cl.
*G11C 7/00* (2006.01)
(52) U.S. Cl.
USPC .............. 365/189.11; 365/189.09; 365/194; 365/193; 365/191; 365/233.1; 365/233.11; 365/148; 365/158; 327/148; 327/145
(58) Field of Classification Search
USPC ............... 365/148, 158, 163, 161, 171, 173, 365/175, 189.09, 189.11, 194, 191, 233.1, 365/233.11; 327/157, 156, 148, 536
See application file for complete search history.

(56) References Cited

U.S. PATENT DOCUMENTS

| 5,313,429 A * | 5/1994 | Chevallier et al. ............. 365/226 |
| 5,642,073 A * | 6/1997 | Manning ........................ 327/536 |
| 5,982,222 A * | 11/1999 | Kyung .......................... 327/536 |
| 6,154,411 A * | 11/2000 | Morishita ....................... 365/226 |
| 6,567,309 B2 * | 5/2003 | Tanzawa ................... 365/185.18 |
| 6,603,340 B2 * | 8/2003 | Tachimori ....................... 327/262 |
| 6,654,306 B2 * | 11/2003 | Merritt et al. .................. 365/226 |
| 7,567,118 B2 * | 7/2009 | Azuma et al. .................. 327/536 |
| 7,724,603 B2 * | 5/2010 | Choy et al. ..................... 365/226 |
| 7,961,036 B2 * | 6/2011 | Park ............................. 327/536 |
| 7,990,754 B2 * | 8/2011 | Azuma et al. .................. 365/148 |
| 7,999,605 B2 * | 8/2011 | Seo ............................... 327/536 |
| 2010/0308901 A1 * | 12/2010 | Im ................................ 327/536 |

FOREIGN PATENT DOCUMENTS

| JP | 10-337002 | 12/1998 |
| JP | 2001-285035 | 10/2001 |
| JP | 2005-295647 | 10/2005 |
| WO | WO/2008/149493 | * 12/2008 |

OTHER PUBLICATIONS

U.S. Appl. No. 12/885,881, filed Sep. 20, 2010, Kawaguchi, et al.

* cited by examiner

*Primary Examiner* — Kretelia Graham
(74) *Attorney, Agent, or Firm* — Oblon, Spivak, McClelland, Maier & Neustadt, L.L.P.

(57) ABSTRACT

According to one embodiment, a semiconductor storage device includes a memory cell array and a control circuit. The memory cell array has memory cells arranged therein at respective intersections between a plurality of first wirings and a plurality of second wirings. Each of the memory cells has a variable resistance element. The control circuit is configured to apply a voltage to a selected one of the first wirings and to a selected one of the second wirings. The control circuit includes a plurality of charge pump circuits and a plurality of clock oscillator circuits. The charge pump circuits generate a voltage applied to the first and second wirings. Each of the clock oscillator circuits is configured to supply a clock signal to a certain number of the charge pump circuits to control the timing of operation thereof. The clock oscillator circuits are configured to output clock signals at different frequencies.

11 Claims, 8 Drawing Sheets

Clock Signal

PRIOR ART

SEMICONDUCTOR STORAGE DEVICE INCLUDING PLURAL CLOCK OSCILLATOR CIRCUITS OPERATING AT DIFFERENT FREQUENCIES

CROSS REFERENCE TO RELATED APPLICATIONS

This application is based upon and claims the benefit of priority from prior Japanese Patent Application No. 2010-39302, filed on Feb. 24, 2010, the entire contents of which are incorporated herein by reference.

BACKGROUND

1. Field

Embodiments described herein relate generally to a semiconductor storage device.

2. Description of the Related Art

Resistive memory devices that use variable resistance elements as storage elements have attracted increased attention as a likely candidate for replacing flash memory. As described herein, it is assumed that the resistive memory devices include Resistive RAM (ReRAM) in a narrow sense that uses a transition metal oxide as a recording layer and stores its resistance states in a non-volatile manner, as well as Phase Change RAM (PCRAM) that uses chalcogenide or the like as a recording layer to utilize the resistance information of crystalline states (conductors) and amorphous states (insulators), and so on.

It is known that the memory cells in resistive memory devices have two modes of operation. One is to set a high resistance state and a low resistance state by switching the polarity of the applied voltage, which is referred to as "bipolar type". The other enables the setting of a high resistance state and a low resistance state by controlling the voltage values and the voltage application time, without switching the polarity of the applied voltage, which is referred to as "unipolar type".

For unipolar-type ReRAM, as an example, data is written to a memory cell by applying a certain voltage to a variable resistance element for a short period of time. As a result, the variable resistance element changes from a high resistance state to a low resistance state. The operation of changing a variable resistance element from a high resistance state to a low resistance state is hereinafter referred to as the "set operation". On the other hand, data is erased from a memory cell MC by applying a certain voltage for a long period of time that is lower than the voltage applied in the set operation to a variable resistance element in its low resistance state after the set operation. As a result, the variable resistance element changes from a low resistance state to a high resistance state. The operation of changing a variable resistance element from a low resistance state to a high resistance state is hereinafter referred to as the "reset operation". For example, a memory cell takes a high resistance state as a stable state (reset state), and, for binary storage, data is written to the memory cell by a set operation that causes a reset state to be switched to a low resistance state.

When an operation is performed on a resistive memory device, such a voltage is generated by a boost circuit provided on a semiconductor substrate that is required for changing the state of a relevant memory cell. The boost circuit may include a plurality of charge pumps provided in a distributed manner on the semiconductor substrate. In outputting a high voltage required for a variable resistance element to transition between resistance states, concurrent operation of multiple charge pumps included in the boost circuit leads to a very large instantaneous increase (jitter) in the boosted voltage. This large jitter causes variations in voltage used in operation, which may result in erroneous write or breakdown of memory cells.

DETAILED DESCRIPTION

According to one embodiment, a semiconductor storage device includes a memory cell array, a plurality of memory blocks, and a control circuit. The memory cell array has memory cells arranged therein at respective intersections between a plurality of first wirings and a plurality of second wirings. Each of the memory cells has a variable resistance element. Each of the memory blocks has a plurality of the memory cell arrays laminated on a semiconductor substrate. The control circuit is configured to apply a voltage to a selected one of the first wirings and to a selected one of the second wirings so that a certain potential difference is applied to a selected memory cell positioned at an intersection between the selected first wiring and the selected second wiring. The control circuit includes a plurality of charge pump circuits and a plurality of clock oscillator circuits. The charge pump circuits are configured to generate a voltage applied to the first and second wirings. Each of the clock oscillator circuits is configured to supply a clock signal to a certain number of the charge pump circuits to control the timing of operation thereof. Each of the charge pump circuits is provided at a region immediately below a respective one of the memory blocks. The clock oscillator circuits are configured to output clock signals at different frequencies.

A semiconductor storage device according to embodiments of the present invention will now be described below with reference to the accompanying drawings.

First Embodiment

[Configuration of Semiconductor Storage Device in First Embodiment]

Figure 1:
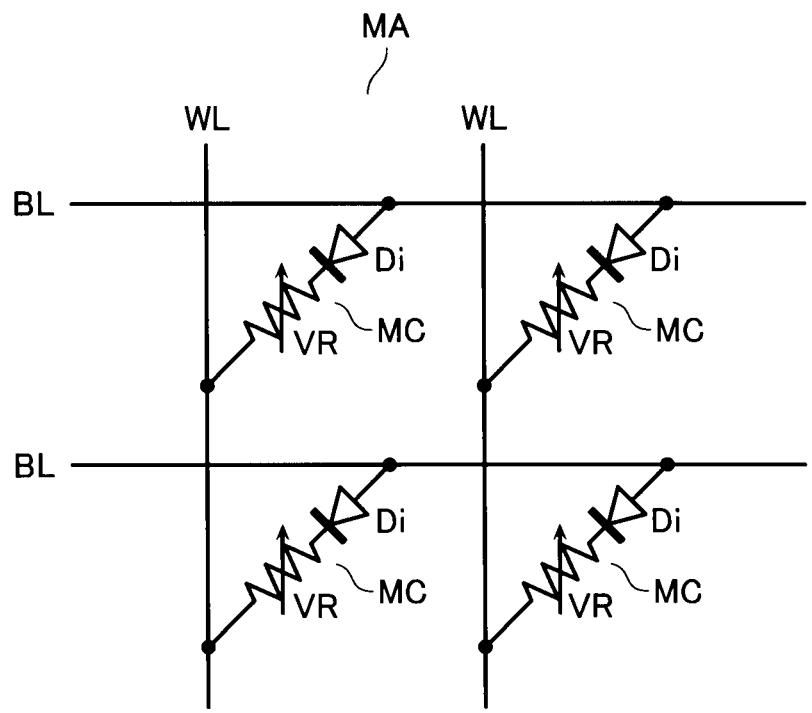
FIG. 1 is an equivalent circuit diagram illustrating apart of a memory cell array in a semiconductor storage device according to a first embodiment.
Figure 2:
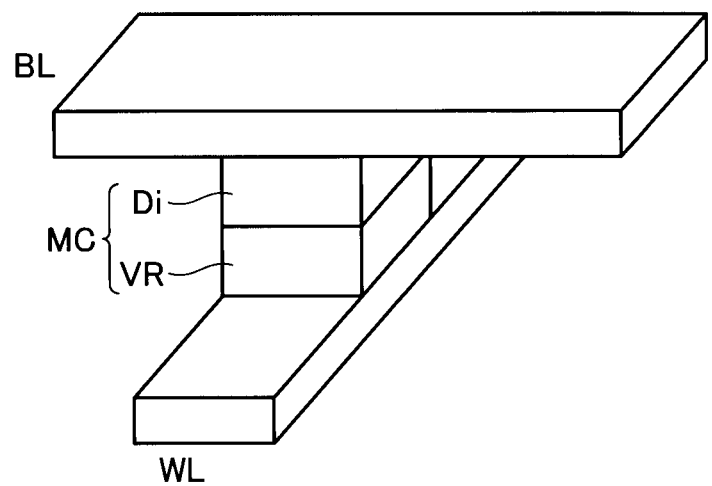
FIG. 2 is a perspective view illustrating a part of the memory cell array in the semiconductor storage device according to the first embodiment.

FIGS. 1 and 2 are an equivalent circuit diagram and a perspective view illustrating a memory cell array in a semiconductor storage device according to an embodiment of the present invention. The semiconductor storage device comprises: a plurality of word lines WL arranged in parallel to each other; and a plurality of bit lines BL intersecting the word lines WL and arranged in parallel to each other. A memory cell MC is arranged at each intersection between the word lines WL and the bit lines BL, with its one end connected to the bit line BL and the other end to the word line WL. These bit lines BL, word lines WL, and memory cells MC are included in a memory cell array MA.

FIG. 2 is a perspective view illustrating a part of the memory cell array MA of FIG. 1. The memory cell array MA has memory cells MC arranged therein at respective intersections between word lines WL and bit lines BL arranged to intersect the word lines WL. Each memory cell MC is of unipolar type, including: a variable resistance element VR that transitions between at least two resistance states, a low resistance state and a high resistance state; and a selection element including a non-ohmic element, e.g., a diode D1. However, the present invention is not limited to the unipolar-type memory cells MC, but may also be applicable to other semiconductor storage devices having bipolar-type memory cells MC. It is also intended that the order of connection between variable resistance elements VR and diodes Di, the polarity of diodes Di and the like not be limited to the depicted embodiments.

The semiconductor storage device of this embodiment as illustrated in FIGS. 1 and 2 has a configuration of so-called cross-point type. With the cross-point type configuration, the word lines WL and the bit lines BL may be merely in a line-and-space pattern. Thus, it is not necessary to consider any misalignment in the word line WL direction or in the bit line BL direction. As such, it is only necessary to position the word lines WL and the bit lines BL orthogonally to each other. Therefore, it is possible to relax the precision of alignment in the memory cell array MA in the manufacturing process, allowing the semiconductor storage device to be manufactured with ease.

The following can be used as the variable resistance elements VR: changing resistance values with a phase transition between a crystalline state and an amorphous state, such as chalcogenide (PCRAM); changing resistance values by depositing metal cations to form a contacting bridge between electrodes, or ionizing the deposited metal to break down the contacting bridge (CBRAM); changing resistance values through application of voltage or current (ReRAM) (which is divided broadly into two types: one is the type where a resistance change occurs depending on the absence or presence of electric charges trapped by a charge trapping residing on the electrode interface; and the other is the type where a resistance change occurs depending on the absence or presence of a conductive path due to oxygen defect); and so on. Particularly, in the case of ReRAM, $ZnMn_2O_4$, NiO, $TiO_2$, $SrZrO_3$, $Pr_{0.7}Ca_{0.3}MnO_3$, and the like may be used.

For unipolar-type ReRAM, data is written to a memory cell MC by applying, for on the order of 10 ns to 100 ns, a voltage of, e.g., 3.5V (in fact, on the order of 4.5V, including a voltage drop in the corresponding diode D1) and a current of on the order of 10 nA to a variable resistance element VR. Accordingly, the variable resistance element VR changes from a high resistance state to a low resistance state (set operation).

On the other hand, data is erased from a memory cell MC by applying, for on the order of 500 ns to 2 μs, a voltage of 0.8V (in fact, on the order of 2.0V, including a voltage drop in the corresponding diode D1) and a current of on the order of 1 μA to 10 μA to the variable resistance element VR in its low resistance state after the set operation. Accordingly, the variable resistance element VR changes from a low resistance state to a high resistance state (reset operation).

A read operation from a memory cell MC is performed by applying a voltage of 0.4V (in fact, on the order of 1.4V, including a voltage drop in the corresponding diode D1) to the variable resistance element VR, and monitoring at a sense amplifier the current flowing through the variable resistance element VR. Accordingly, it is determined whether the variable resistance element VR is in a low resistance or high resistance state.

Figure 3:
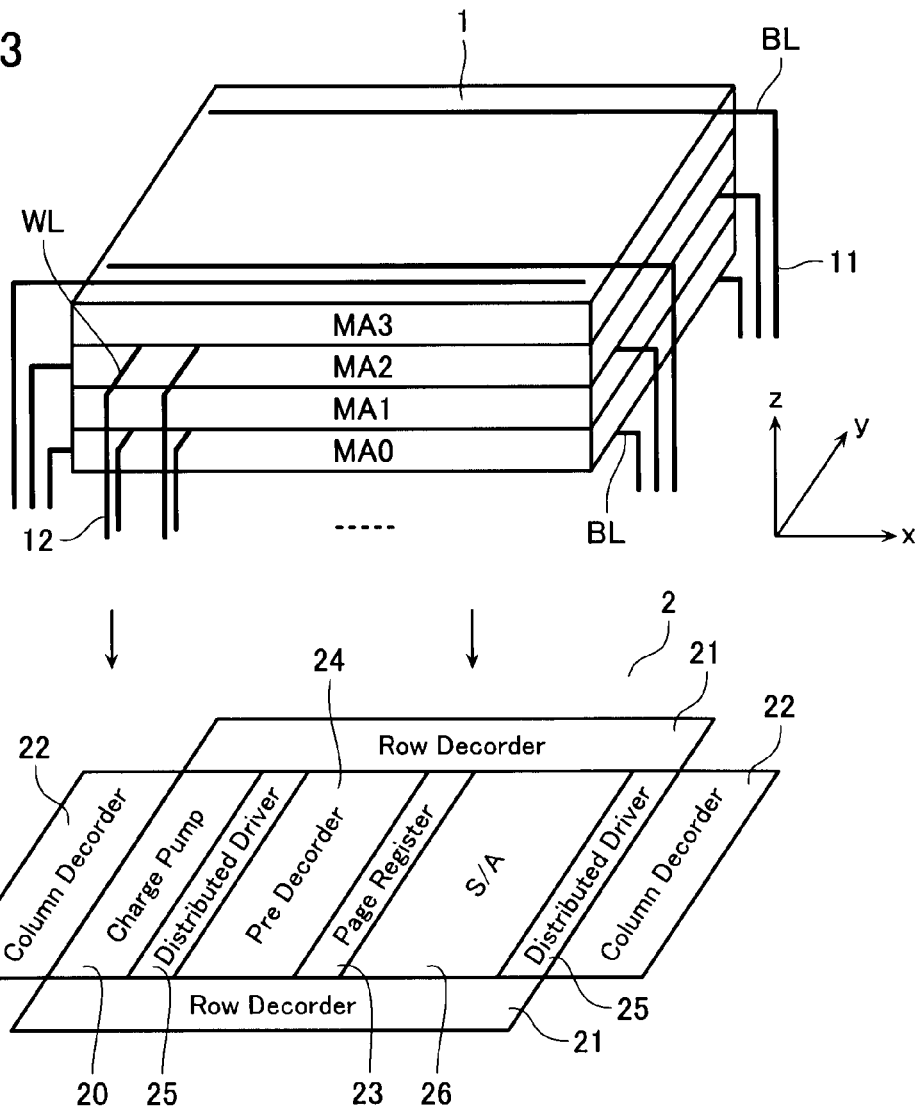
FIG. 3 is a perspective view of a memory block and a control circuit in the semiconductor storage device according to the first embodiment.

FIG. 3 is an exploded perspective view of a memory block 1 as well as a control circuit for use in read/write operation which is formed on a semiconductor substrate 2 in the semiconductor storage device according to this embodiment. Note that while a single memory block 1 is illustrated here, such memory blocks 1 are indeed arranged in a matrix form.

For example, the memory block 1 includes four layers of memory cell arrays MA0 to MA3 laminated in a three dimensional manner. As described above, each memory cell array MAn (n=0 to 3) in each layer includes memory cells MC arranged therein at respective intersections between bit lines BL extending in the x direction in parallel to the semiconductor substrate 2 and word lines WL extending in the y direction so as to intersect the bit lines BL. In the memory block 1 of FIG. 3, bit lines BL or word lines WL are shared between two layers adjacent in a lamination direction (z direction as illustrated). That is, the word lines WL are shared between a first layer memory cell array MA0 and a second layer memory cell array MA1, and between a third layer memory cell array MA2 and a fourth layer memory cell array MA3. In addition, bit lines BL are shared between the second layer memory cell array MA1 and the third layer memory cell array MA2. The bit lines BL of the first layer memory cell array MA0 are only used for the memory cell array MA0 because they are not shared with other memory cell arrays MA. The bit lines BL of the fourth layer memory cell array MA3 are also only used for the memory cell array MA3 because they are not shared with other memory cell arrays MA.

A control circuit for use in read/write operation is formed on the semiconductor substrate 2 below the memory block 1. Two rows of row decoders 21 are formed on the semiconductor substrate 2 that are arranged along two sides of the memory block 1 along the x-axis direction as its longitudinal direction. The row decoders 21 are formed in those regions on the semiconductor substrate 2 that are located adjacent to the region immediately below the memory block 1. The word lines WL have respective ends that are drawn out of the memory block 1 by vertical via contacts 12 and connected to the row decoders 21. In addition, two rows of column decoders 22 are formed on the semiconductor substrate 2 that are arranged along two sides of the memory block 1 along the y-axis direction as its longitudinal direction. The column decoders 22 are also formed in other regions on the semiconductor substrate 2 that are located adjacent to the region immediately below the memory block 1. The bit lines BL have respective ends that are drawn out of the memory block 1 by vertical via contacts 11 and connected to the column decoders 22.

The other peripheral circuits required for operation of the semiconductor storage device are formed in the region immediately below the memory block 1. The peripheral circuits include a page resister 23, a pre-decoder 24, distributed drivers 25, a charge pump 20, and a sense amplifier 26. Necessary information for operation is input to the page resister 23 via a data bus from outside. The information input to the page resister 23 is processed by the pre-decoder 24 and sent to the column decoders 22 and the row decoders 21 as a selected bit line address and a selected word line address, respectively. Then, a combination of certain voltages corresponding to read, write and erase operations is applied to the selected bit line BL and the selected word line WL by the distributed drivers 25 via the column decoders 22 and the row decoders 21. When applying a read voltage to the selected bit line BL, the sense amplifier 26 monitors the current flowing through a variable resistance element VR to determine the resistance state of the variable resistance element.

In this case, the charge pump 20 is provided as a boost circuit for generating a voltage to be applied to a selected bit line BL and a selected word line WL from the column decoders 22 and the row decoders 21. As described above, the memory blocks 1 as illustrated in FIG. 3 are arranged in a matrix form on the semiconductor substrate 2. A charge pump 20 is positioned below each of the memory blocks 1. A plurality of charge pumps 20 are operated to generate a voltage required for operation. The voltage generated by the charge pumps 20 is supplied to the column decoders 22 and the row decoders 21 via the distributed drivers 25.

Figure 4:
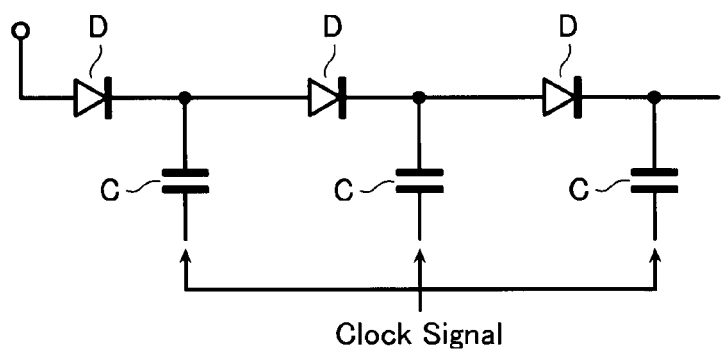
FIG. 4 is a circuit diagram illustrating a control circuit in the semiconductor storage device according to the first embodiment.

The boost circuit illustrated in FIG. 4 is used as, e.g., a charge pump 20. This boost circuit is a charge pump circuit in which respective capacitors C have first ends connected to respective stages of serially connected diodes D, and the second ends to which a clock signal is supplied. As the potential at the second ends of the capacitors C is controlled based on a clock signal, the potential at the first ends of the capacitors to which the diodes D are connected are increased accordingly. This is repeated by the boost circuit to generate a boosted voltage.

If a plurality of charge pumps 20 are operated concurrently based on the same clock signal, there is a very large instantaneous increase (jitter) in the boosted voltage. This large jitter may cause variations in voltage used in operations such as write operations, which may result in erroneous write or breakdown of memory cells MC. For ease of understanding, a semiconductor storage device according to a comparative example will be first described with reference to a case where a plurality of charge pumps 20 are operated concurrently. Afterwards, the semiconductor storage device according to the first embodiment will be described.

[Configuration of Semiconductor Storage Device in Comparative Example]

Figure 5A:
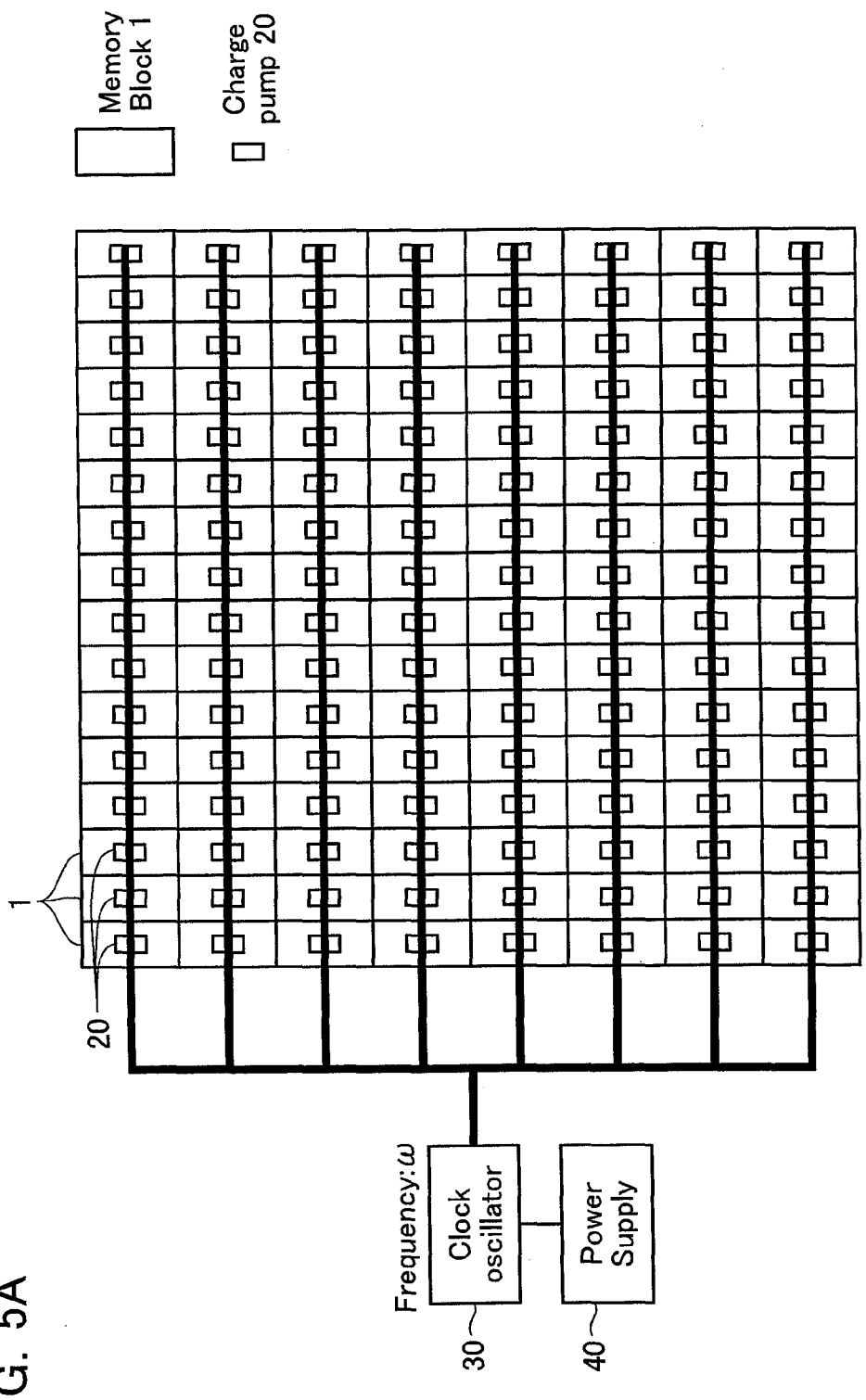
FIG. 5A is a block diagram illustrating a control circuit in a semiconductor storage device according to a comparative example.

A semiconductor storage device according to a comparative example has the same configuration as that of the semiconductor storage device according to the first embodiment, as described above for the peripheral circuits, such as the memory blocks 1, row decoders 21, or column decoders 22. FIG. 5A is a block diagram illustrating a control circuit in the semiconductor storage device according to the comparative example. FIG. 5A illustrates a configuration where a plurality of memory blocks 1 and charge pumps 20 located below the memory blocks 1 are provided in a matrix form on the semiconductor substrate 2. For simplicity, the peripheral circuits other than the charge pumps 20 located below the memory blocks 1 are omitted in FIG. 5A.

Provided on the semiconductor substrate 2 is a clock oscillator 30 that sends a clock signal to a plurality of charge pumps 20 to control the timing of their operation. The clock oscillator 30 is connected to a power supply 40. The clock oscillator 30 generates a clock signal at a certain frequency $\omega$. The same clock signal is distributed to a plurality of charge pumps 20. Only one clock oscillator 30 is provided in the semiconductor storage device of the comparative example. Thus, all the charge pumps 20 operate concurrently based on the same clock signal being output from this clock oscillator 30. The voltage generated by the plurality of charge pumps 20 is commonly used for operation of each of the memory blocks 1.

Figure 5B:
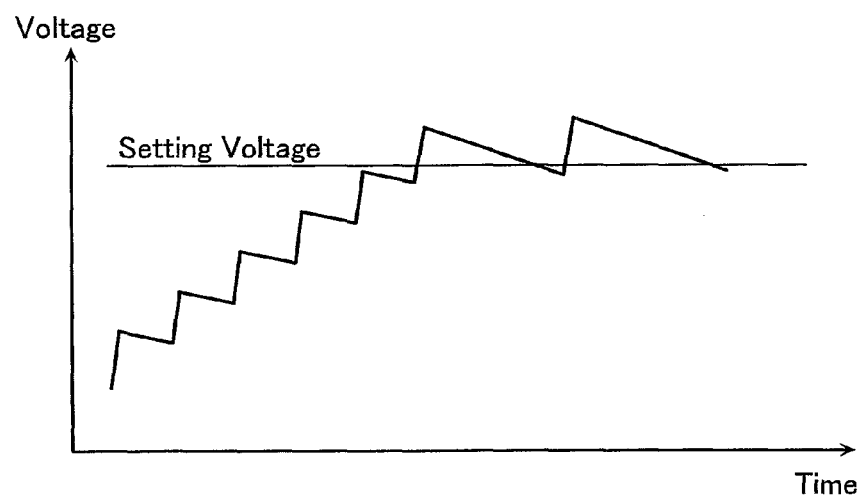
FIG. 5B illustrates an operation waveform of the control circuit in the semiconductor storage device according to the comparative example.

FIG. 5B illustrates an operation waveform of the control circuit in the semiconductor storage device according to the comparative example. After initiation of operation, the voltage is boosted at each operation of the charge pumps to which a clock signal is input. If all the charge pumps 20 operate concurrently based on the clock signal being output from the clock oscillator 30, a significant increase in the voltage is seen at each instant when the charge pumps 20 operate. There might be a situation where the voltage exceeds a setting voltage required for operation of the semiconductor storage device when it is being boosted toward the setting voltage, as illustrated in FIG. 5B. In that case, erroneous write or breakdown of memory cells MC may be caused.

The semiconductor storage device according to the first embodiment may prevent such an excessive increase in voltage to obtain a desired setting voltage. A further description of the semiconductor storage device of this embodiment is given below.

Figure 6A:
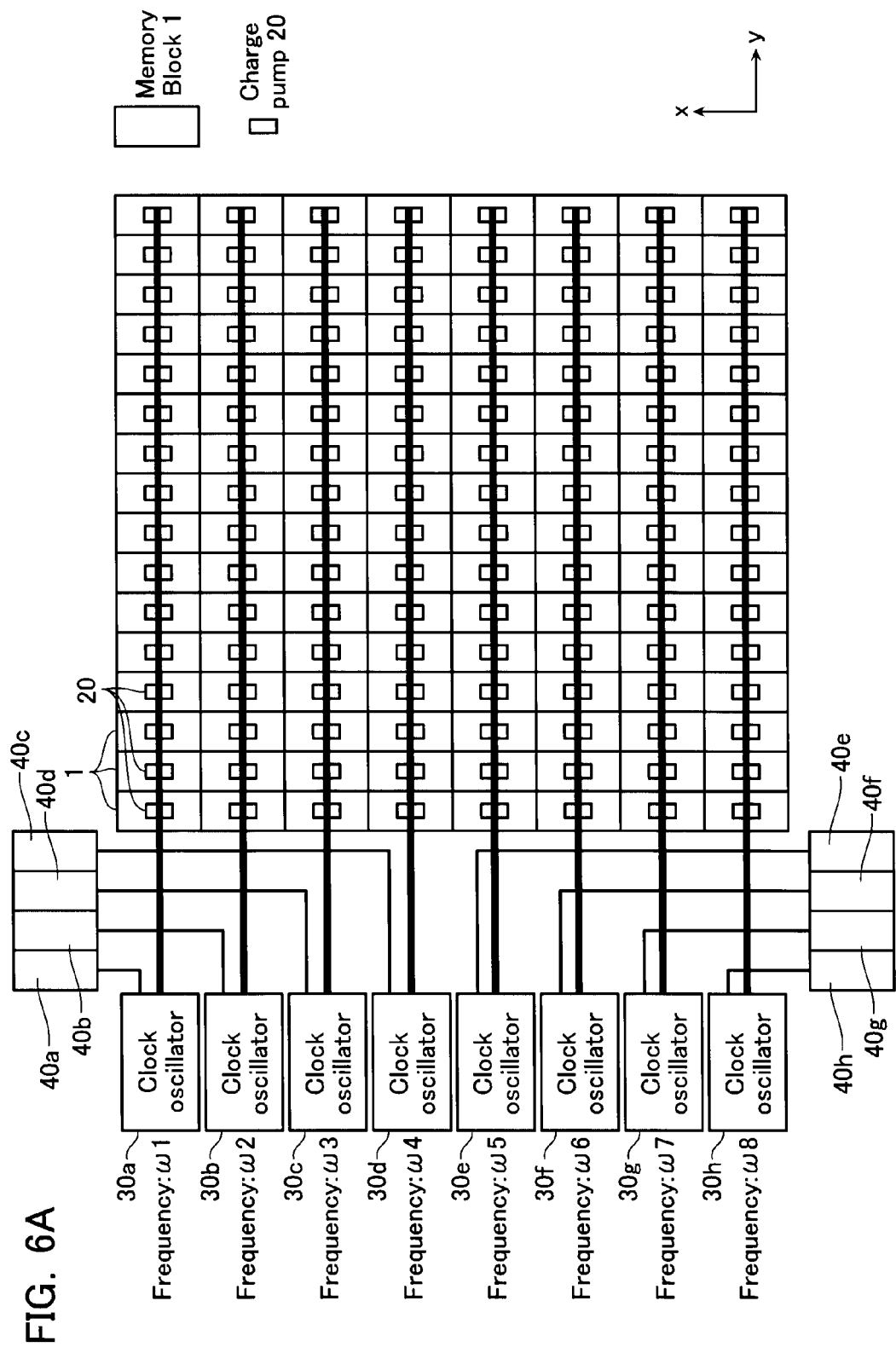
FIG. 6A is a block diagram illustrating a control circuit in the semiconductor storage device according to the first embodiment.

FIG. 6A is a block diagram illustrating a control circuit in the semiconductor storage device according to this embodiment. FIG. 6A illustrates a configuration where a plurality of memory blocks 1 and charge pumps 20 located below the memory blocks 1 are provided in a matrix form on the semiconductor substrate 2. As in FIG. 5A, the peripheral circuits other than the charge pumps 20 located below the memory blocks 1 are also omitted in FIG. 6A.

Provided on the semiconductor substrate 2 are clock oscillators 30$a$ to 30$h$ that send clock signals to a plurality of charge pumps 20 to control the timing of their operation. This embodiment is different from the comparative example illustrated in FIG. 5A in that a plurality of clock oscillators 30 are provided. FIG. 6A illustrates a case where eight memory blocks 1 are arranged along the x direction and sixteen memory blocks 1 are arranged along the y direction. In this embodiment, one clock oscillator 30 is provided for the sixteen memory blocks 1 aligned in the y direction. The plurality of clock oscillators 30$a$ to 30$h$ are connected to different power supplies 40$a$ to 40$h$, respectively. The plurality of clock oscillators 30$a$ to 30$h$ output clock signals at different frequencies $\omega1$ to $\omega8$. It is assumed here that clock signals being output from the clock oscillators 30$a$ to 30$h$ have frequencies that are set to be relatively prime. These clock signals are distributed to a plurality of charge pumps 20. In the semiconductor storage device of this embodiment, the clock signals have different frequencies $\omega1$ to $\omega8$ and so will not be in resonance with each other. Accordingly, the charge pumps 20 operate at different timings. Note that the clock signals may have frequencies that are set in such a way that at least the frequencies being output from neighboring clock oscillators 30 are relatively prime.

Figure 6B:
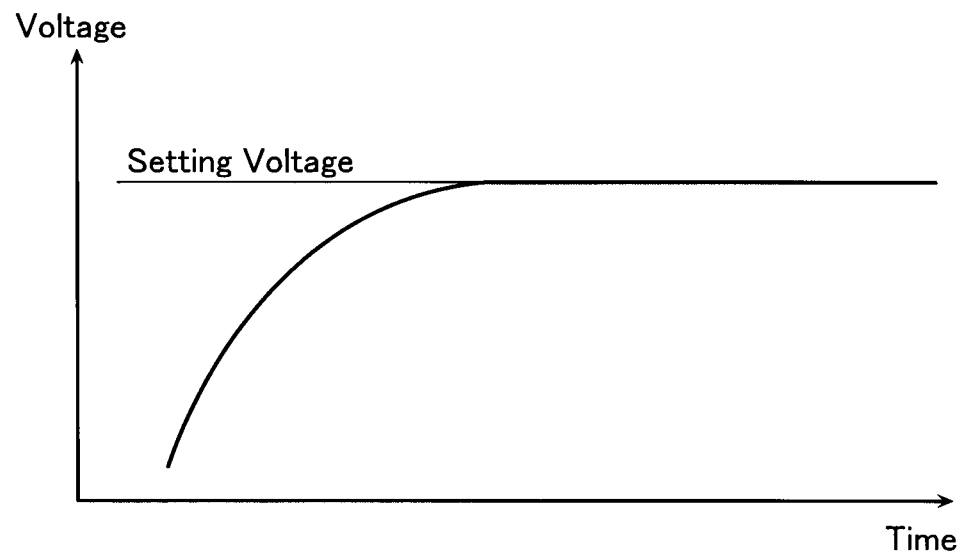
FIG. 6B illustrates an operation waveform of the control circuit in the semiconductor storage device according to the first embodiment.

FIG. 6B illustrates an operation waveform of the control circuit in the semiconductor storage device according to this embodiment. If the charge pumps 20 operate at different timings based on the clock signals at different frequencies ω1 to ω8, the voltage boosted by the charge pumps 20 increases smoothly. The voltage boosted as illustrated in FIG. 6B cannot exceed a setting voltage required for operation of the semiconductor storage device when it is being boosted toward the setting voltage. This boosted voltage allows a desired operation to be performed on a memory cell MC.

Figure 6C:
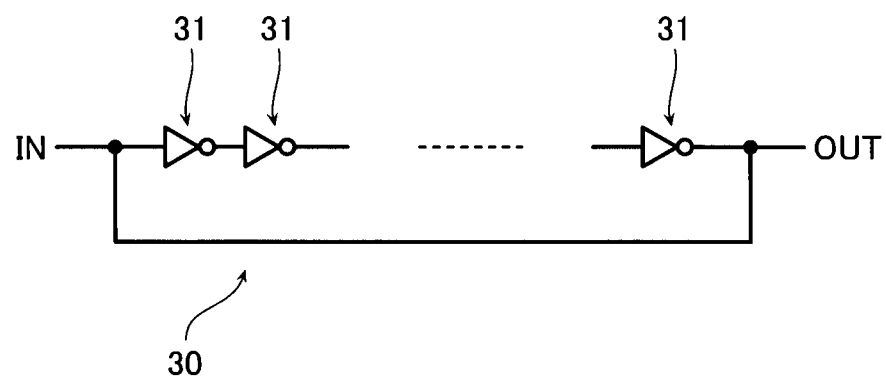
FIG. 6C is a circuit diagram of the control circuit in the semiconductor storage device according to the first embodiment.

As described above, the plurality of clock oscillators 30 output clock signals at different frequencies ω1 to ω8. For example, these clock oscillators 30 may be configured as described below. FIG. 6C is a circuit diagram illustrating an exemplary configuration of a clock oscillator 30 according to this embodiment. The clock oscillator 30 is configured as a ring oscillator having multiple stages of inverters connected in a ring-like fashion. The number of inverters 31 provided in the clock oscillator 30 is odd. A signal is input from an input terminal IN. Based on this input signal, a clock signal which oscillates at a frequency determined by the number of inverters 31 is output from an output terminal OUT. In this case, the plurality of clock oscillators 30a to 30h illustrated in FIG. 6A may include different numbers of stages of inverters 31. This allows the plurality of clock oscillators 30 to output clock signals at different frequencies ω1 to ω8. Illustrated in FIG. 6C is merely an example of configuration of a clock oscillator 30, and another configuration may be utilized.

The clock oscillators 30a to 30h may also be configured to output clock signals at different frequencies ω1 to ω8 due to different voltages of the power supplies 40a to 40h used. In that case, different power supplies 40a to 40h needs only to be connected to the clock oscillators 30a to 30h, respectively, as illustrated in FIG. 6A. This also allows the plurality of clock oscillators 30 to output clock signals at different frequencies ω1 to ω8.

[Advantages of Semiconductor Storage Device in First Embodiment]

In the semiconductor storage device according to this embodiment, operations of the charge pumps 20 are controlled by clock signals being output from the plurality of clock oscillators 30a to 30h. The charge pumps 20 operate at different timings since the clock signals have different frequencies ω1 to ω8. If the charge pumps 20 operate at different timings, the voltage boosted by the charge pumps 20 cannot exceed the setting voltage. This may ensure generation of a voltage required for operation of a selected memory cell MC.

Second Embodiment

[Configuration of Semiconductor Storage Device in Second Embodiment]

Figure 7A:
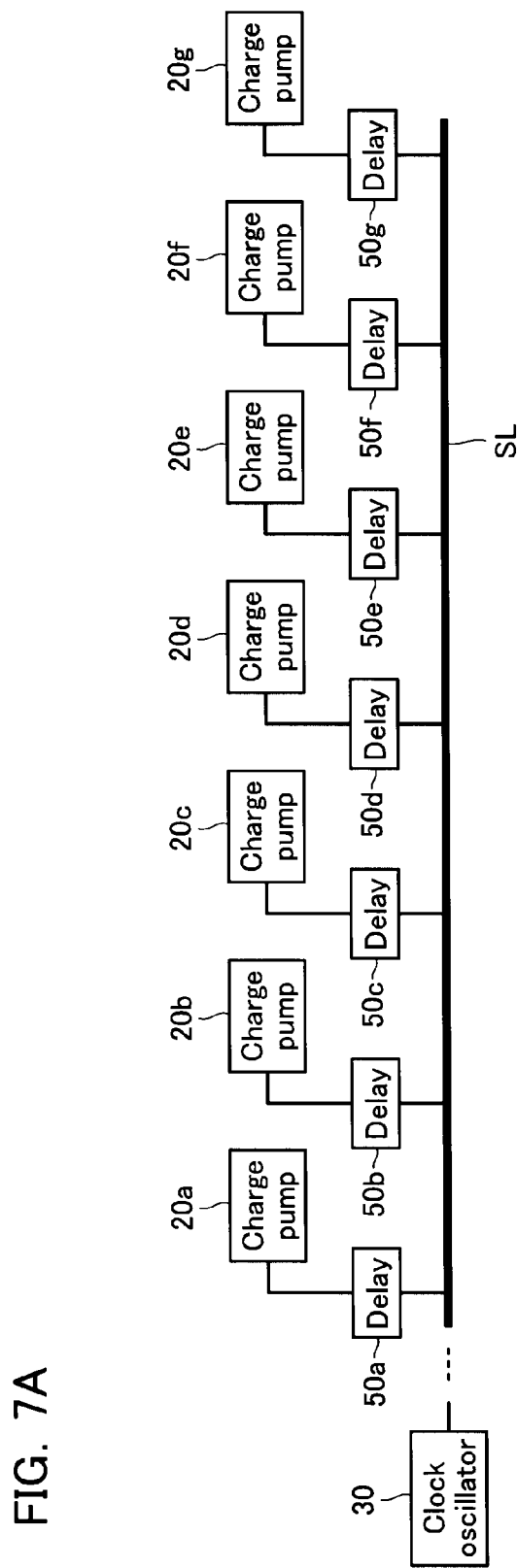
FIG. 7A is a block diagram illustrating a control circuit in a semiconductor storage device according to a second embodiment.
Figure 7B:
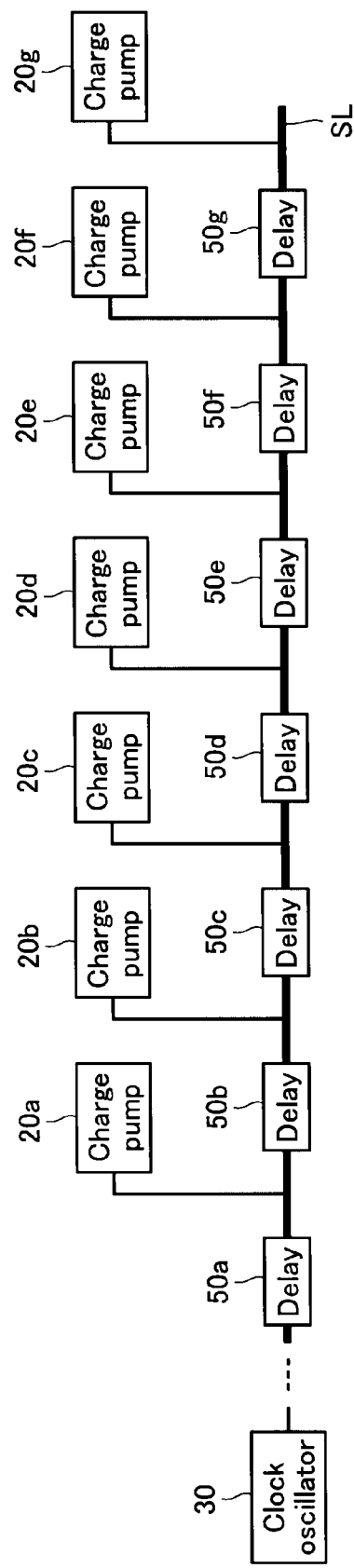
FIG. 7B is a block diagram illustrating a control circuit in the semiconductor storage device according to the second embodiment.

A control circuit in a semiconductor storage device according to a second embodiment of the present invention will now be described below. FIGS. 7A and 7B are block diagrams illustrating a control circuit in the semiconductor storage device of this embodiment. The semiconductor storage device of this embodiment has the same configuration as that of the semiconductor storage device according to the first embodiment, as described above for the memory cell arrays MA, memory blocks 1, charge pumps 20, and so on. The components having the same configuration as the first embodiment are represented by the same reference numerals, and so will not be explained again here.

As illustrated in FIG. 7A, the semiconductor storage device of this embodiment is different from the semiconductor storage device of the first embodiment in that delay circuits 50a to 50g are each provided on a path from a clock oscillator 30 to respective charge pumps 20a to 20g. The plurality of delay circuits 50a to 50g are provided on the semiconductor substrate 2 as with the control circuit including the charge pumps 20, the clock oscillators 30, and so on. The delay circuits 50a to 50g delay input clock signals by certain delay times before outputting them.

FIG. 7A illustrates the delay circuits 50a to 50g that are provided to be connected in series to the charge pumps 20a to 20g, respectively. The serially connected delay circuits 50a to 50g and the charge pumps 20a to 20g are connected to a signal line SL which transmits clock signals. It is assumed here that delay times of clock signals by the delay circuits 50a to 50g are set to be relatively prime. With this setting, clock signals are output from the delay circuits 50a to 50g at different times even if they are transmitted at a certain frequency from the signal line SL.

FIG. 7B illustrates another example of connection of delay circuits 50. FIG. 7B illustrates delay circuits 50a to 50g connected in series along a signal line SL which transmits clock signals. Charge pumps 20a to 20g are connected to respective connection points at which the serially connected delay circuits 50a to 50g are connected with one another. In this case, the delay circuits 50a to 50g illustrated in FIG. 7B may delay clock signals by the same delay time or different delay times. Also, delay times of clock signals may be set to be relatively prime, as is the case with the delay circuits 50a to 50g illustrated in FIG. 7A. By connecting the delay circuits 50 as illustrated in FIG. 7B, clock signals are output from the delay circuits 50 at different times even if they are transmitted at a certain frequency from the signal line SL.

As can be seen from the above, in the semiconductor storage device according to this embodiment, the delay circuits 50a to 50g delay clock signals and output them at different timings. That is, clock signals being output from the delay circuits 50 should be out of phase with each other, and hence the charge pumps 20 whose operations are controlled by output signals from the delay circuits 50 operate at different timings.

If the charge pumps 20 operate at different timings based on the clock signals with different phases, the voltage boosted by the charge pumps 20 increases smoothly. Thus, also in this case, the boosted voltage cannot exceed a setting voltage required for operation of the semiconductor storage device when it is being boosted toward the setting voltage (see FIG. 6B). This boosted voltage allows a desired operation to be performed on a memory cell MC.

[Advantages of Semiconductor Storage Device in Second Embodiment]

In the semiconductor storage device according to this embodiment, operations of the charge pumps 20 are controlled by clock signals being output from a clock oscillator 30. The charge pumps 20 operate at different timings due to the clock signals with different phases. If the charge pumps 20 operate at different timings, the voltage boosted by the charge pumps 20 cannot exceed the setting voltage. This may ensure generation of a voltage required for operation of a selected memory cell MC.

While embodiments of the present invention have been described, the present invention is not intended to be limited to the disclosed embodiments, and various other changes, additions or the like may be made thereto and any combination thereof may be used, without departing from the spirit of the invention. For example, the operation of providing different frequencies of clock signals being output from a clock oscillator for different charge pumps and the operation of delaying clock signals by the delay circuits 50 are described separately in the above-mentioned embodiments. However, these operations may be implemented in combination with each other.

What is claimed is:

1. A semiconductor storage device comprising:
a memory cell array having memory cells arranged therein at respective intersections between a plurality of first wirings and a plurality of second wirings, each of the memory cells including a variable resistance element;
a plurality of memory blocks, each having a plurality of memory cell arrays laminated on a semiconductor substrate; and
a control circuit configured to apply a voltage to a selected one of the first wirings and to a selected one of the second wirings so that a certain potential difference is applied to a selected memory cell positioned at an intersection between the selected first wiring and the selected second wiring,
the control circuit comprising:
a plurality of charge pump circuits configured to generate a voltage applied to the first and second wirings;
a plurality of clock oscillator circuits each configured to supply a clock signal to a certain number of the charge pump circuits to control a timing of operation thereof; and
a plurality of delay circuits each provided on a path from a respective one of the clock oscillator circuits to each of a plurality of the charge pump circuits, and configured to delay the clock signal by a certain delay time;
each of the charge pump circuits being provided at a region immediately below a respective one of the memory blocks,
the plurality of clock oscillator circuits being configured to output clock signals at different frequencies,
each of the plurality of delay circuits being configured to provide a delay time of the clock signal different from those of other ones of the plurality of delay circuits,
each of the delay circuits being provided between the path and each of the plurality of charge pump circuits so as to be connected in series with each of the charge pump circuits, and
the delay circuits being formed to delay clock signals so that delay times of the clock signals are relatively prime.

2. The semiconductor storage device according to claim 1, wherein
the clock oscillator circuits are ring oscillators having multiple stages of inverters connected in a ring-like fashion, and
the plurality of clock oscillator circuits are configured to output clock signals at different frequencies due to different numbers of stages of the inverters included in the clock oscillator circuits.

3. The semiconductor storage device according to claim 1, wherein
the clock oscillator circuits are configured to output clock signals at different frequencies due to different power supply voltages used by the clock oscillator circuits.

4. The semiconductor storage device according to claim 1, wherein
the delay circuits are connected in series on the path, and
each of the charge pump circuits is connected to respective connection points of the delay circuits.

5. The semiconductor storage device according to claim 4, wherein
the delay circuits are formed so as to delay the clock signals by relatively prime delay times.

6. The semiconductor storage device according to claim 1, wherein
the first or second wirings are shared between two neighboring memory cell arrays in a lamination direction.

7. A semiconductor storage device comprising:
a memory cell array having memory cells arranged therein at respective intersections between a plurality of first wirings and a plurality of second wirings, each of the memory cells including a variable resistance element; and
a control circuit configured to apply a voltage to a selected one of the first wirings and to a selected one of the second wirings so that a certain potential difference is applied to a selected memory cell positioned at an intersection between the selected first wiring and the selected second wiring,
the control circuit comprising:
a plurality of charge pump circuits configured to generate a voltage applied to the first and second wirings;
a plurality of clock oscillator circuits each configured to supply a clock signal to a certain number of the charge pump circuits to control a timing of operation thereof; and
a plurality of delay circuits each provided on a path from a respective one of the clock oscillator circuits to each of a plurality of the charge pump circuits, and configured to delay the clock signal by a certain delay time;
the plurality of clock oscillator circuits being configured to output clock signals at different frequencies,
each of the plurality of delay circuits being configured to provide a delay time of the clock signal different from those of other ones of the plurality of delay circuits,
each of the delay circuits being provided between the path and each of the plurality of charge pump circuits so as to be connected in series with each of the charge pump circuits, and
the delay circuits being formed to delay clock signals so that delay times of the clock signals are relatively prime.

8. The semiconductor storage device according to claim 7, wherein
the clock oscillator circuits are ring oscillators having multiple stages of inverters connected in a ring-like fashion, and
the plurality of clock oscillator circuits are configured to output clock signals at different frequencies due to different numbers of stages of the inverters included in the clock oscillator circuits.

9. The semiconductor storage device according to claim 7, wherein
the clock oscillator circuits are configured to output clock signals at different frequencies due to different power supply voltages used by the clock oscillator circuits.

10. The semiconductor storage device according to claim 7, wherein
the delay circuits are connected in series on the path, and
each of the charge pump circuits is connected to respective connection points of the delay circuits.

11. The semiconductor storage device according to claim 10, wherein
the delay circuits are formed so as to delay the clock signals by relatively prime delay times.

* * * * *